United States Patent [19]

Lippmann et al.

[11] Patent Number: 5,146,154
[45] Date of Patent: Sep. 8, 1992

[54] CIRCUIT WITH RATIOMETRIC ANALOG INPUTS

[75] Inventors: Raymond Lippmann, Ann Arbor; James E. Nelson, Union Lake; Michael J. Schnars, Clarkston; James R. Chintyan, Davison, all of Mich.; James M. Aralis, Mission Viejo; Frank J. Bohac, Jr., Laguna Hills, both of Calif.

[73] Assignees: Delco Electronics Corp., Kokomo, Ind.; Hughes Aircraft Company, Los Angeles, Calif.

[21] Appl. No.: 750,082

[22] Filed: Aug. 27, 1991

[51] Int. Cl.[5] .................... G01L 1/18; G01R 17/10
[52] U.S. Cl. .................... 323/367; 323/354; 323/365
[58] Field of Search ............ 323/352, 353, 354, 364, 323/365, 367

[56] References Cited

U.S. PATENT DOCUMENTS

| | | | |
|---|---|---|---|
| 3,439,258 | 4/1969 | Van Leeuwen | 323/367 |
| 3,568,044 | 3/1971 | Elazar | 323/367 |
| 3,651,696 | 3/1972 | Rose | 323/367 |
| 4,171,509 | 10/1979 | Stephens et al. | 323/367 |
| 4,250,750 | 2/1981 | Martinec et al. | 73/308 |
| 4,516,865 | 5/1985 | Hideo | 323/365 |
| 4,614,114 | 9/1986 | Matsumoto et al. | 73/313 |
| 4,635,043 | 1/1987 | Kronenberg et al. | 340/618 |
| 4,639,611 | 1/1987 | Sticher | 323/365 |
| 4,760,736 | 8/1988 | Huynh | 73/430 |
| 4,768,377 | 9/1988 | Habelmann et al. | 73/313 |

*Primary Examiner*—Peter S. Wong
*Attorney, Agent, or Firm*—Anthony Luke Simon

[57] ABSTRACT

A circuit disclosed maintains ratiometric analog inputs to an integrated circuit using a network of resistors, some of which are external to the integrated circuit and some of which are internal to the integrated circuit, reducing expense. The analog inputs maintain a fixed ratio during fluctuations in supply voltage and fluctuations in temperature.

6 Claims, 2 Drawing Sheets

CIRCUIT WITH RATIOMETRIC ANALOG INPUTS

This invention relates to interfacing analog signals with integrated circuits, and more particularly to maintaining ratiometric analog inputs for integrated circuits.

BACKGROUND OF THE INVENTION

When analog signals are measured in systems such as those found in motor vehicles, they are usually measured in a ratiometric manner. FIG. 1 shows a typical system for processing analog signals in motor vehicles. In the figure, line 12 represents the vehicle power supply line, which typically carries a positive DC voltage of approximately 13 volts when the vehicle ignition is on, and zero volts when the vehicle ignition is off. A load resistor 14 is connected in series with sender 28, which has a resistance that varies in relation to a vehicle parameter. An example for sender 28 is the type of variable resistive sender typically used to measure fuel level, oil pressure, engine temperature, etc.. Resistor 14 and sender 28 act as a voltage divider, with the voltage signal on line 18, which may be referred to as the sender output signal, varying in relation to the impedance of sender 28, and therefore in relation to the parameter being measured.

A second voltage divider comprising resistors 20 and 30 is connected between line 18 and ground 34. The second voltage divider couples the signal on line 18 to input line 22 of comparator 24. The signal on input line 22 is proportional to the sender output signal on line 18. The ratio of resistors 20 and 30 ensure that the voltage on line 22 is less than or equal to the supply voltage for comparator 24. Resistor 20 is large enough to protect the input of comparator 22 from voltage transients which would otherwise cause current surges at the input of comparator 24.

A third voltage divider comprising resistors 16 and 32 is connected between line 12 and ground line 34. This third voltage divider sets the reference voltage at the second input line 23 for comparator 24. Comparator 24 may be of the type having an analog output or of the type having a digital output, depending upon the system requirements.

In a systems such as those found in automobiles, the supply voltage on line 12 is subject to a large amount of voltage transients. Regulated power supplies for systems such as those found on vehicles are avoided because of the expense of regulating the whole power supply system and the fact that much of the vehicle electrical systems do not need a regulated supply. In the circuit shown, the fact that the ignition voltage on line 12 may vary does not affect the output line 26 of comparator 24 because the resistor dividers provide signal on lines 22 and 23 that have a constant ratio to one another, as long as the resistors have the same temperature coefficient.

Assuming comparator 24 is in an integrated circuit, according to the prior art, resistors 14, 16, 20, 30 and 32 and sender 28 must all be external components. Resistors 16 and 20 must be external because they are necessary to protect the integrated circuit from current surges. According to the prior art, resistors 30 and 32 must also be external because it is impractical to try to make resistances on integrated circuits that have the same temperature coefficient as the external resistors. If resistors 30 and 32 do not have the same temperature coefficient as resistors 16 and 20, the ratio of the input lines 22 and 23 may no longer be dependent on just resistor 14 and the impedance of sender 28, and will vary with temperature.

What is desired is means for minimizing external components when interfacing ratiometric inputs with integrated circuitry because reducing the number of external components reduces the system cost.

SUMMARY OF THE PRESENT INVENTION

This invention provides a circuit for maintaining ratiometric analog inputs for integrated circuitry while reducing the number of external components required by the system. By specifying certain resistances according to this invention, two of the external resistors required by the prior art can be fabricated onto the integrated circuit, reducing the cost of implementing the system. Moreover, the circuit of this invention maintains the ratiometric analog inputs in relation to the sender impedance and the resistance of the load resistor for the sender.

Structurally, this invention comprises a first voltage divider including a load resistor having a resistance RL and variable impedance sender having an impedance Rs, the first voltage divider having an output line at the connection between the load resistor and the variable impedance sender. The first voltage divider is coupled between a voltage supply and ground. A second voltage divider, comprising resistors one and two connected in series and having resistances R1 and R2, respectively, is coupled between the output line of the first voltage divider and ground. A connection between resistors one and two is a signal line having voltage Vin. A third voltage divider comprising resistors three and four, having resistances R3 and R4, is coupled between the voltage supply and ground. A connection to resistor 4 is a reference line having voltage kVref, where k is a constant. The resistances are maintained such that $Rs << R1+R2$, $R1=R3$, and $R2=R4$ and resistors three and four to be fabricated onto the integrated circuit while maintaining the ratio of the input lines at: $Vin/kVref = (1/k)(Rs/(RL+Rs))$.

Further implementations of this invention are set forth in the detailed description below.

DETAILED DESCRIPTION OF THE INVENTION

Figure 1:
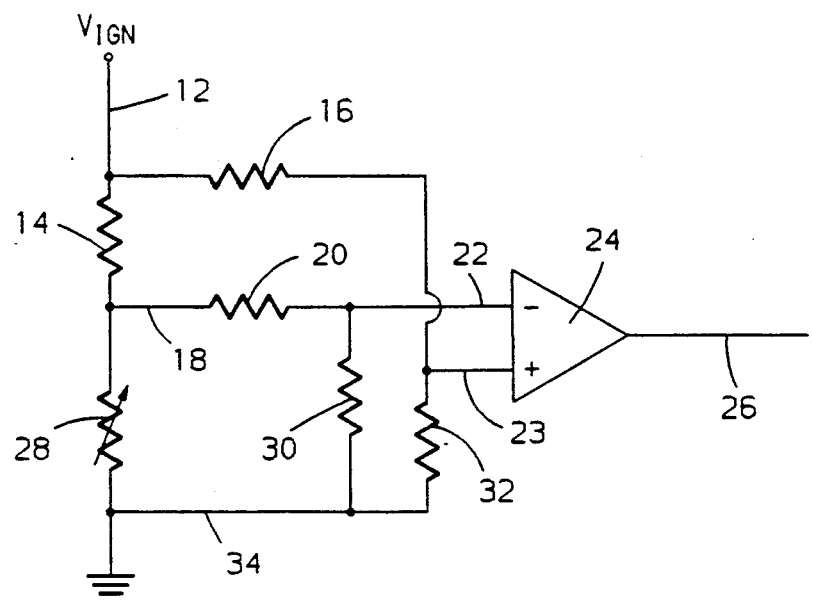
FIG. 1 is an illustration typical prior art.
Figure 2:
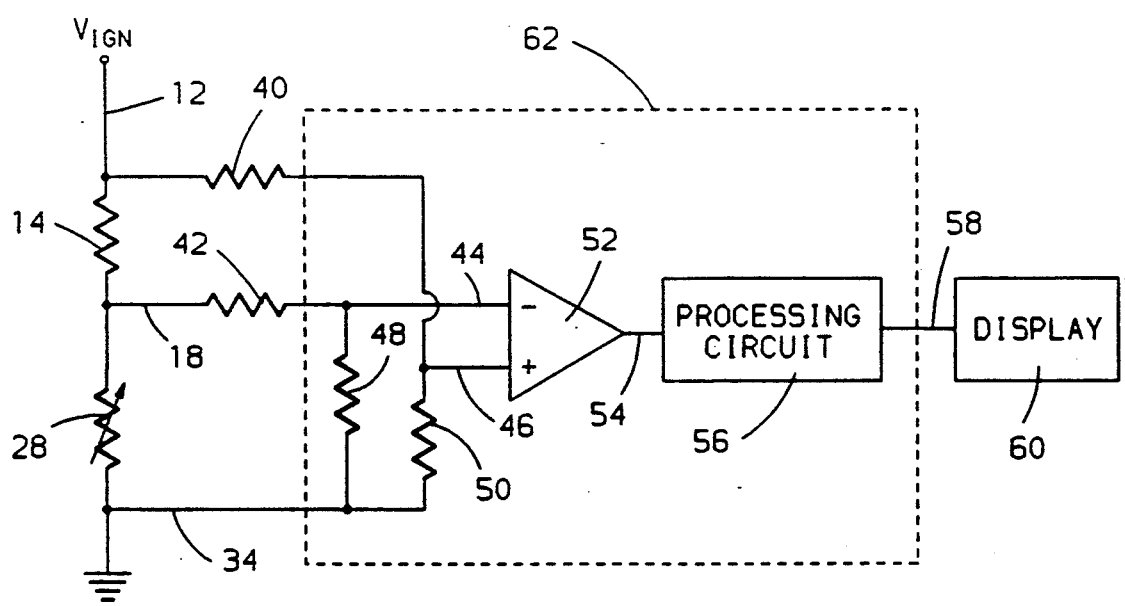
FIG. 2 is an illustration of a first implementation of this invention.

Referring to FIG. 2, the circuit of this invention is shown, including external resistors 14, 40, and 42, sender 28, and integrated circuit components 48, 50 (resistors) and 52 (a comparator serving as a ratiometric signal receiving circuit). The invention is shown with integrated circuit 62 including a processing circuit 56 for processing data on line 54 output from comparator 52. Processing circuit 56 drives an external display 60 via line 58.

Resistor 14 and sender 28 comprise a first voltage divider, which is coupled between line 12 and ground. Sender 28 has an impedance, Rs, that varies in relation to the vehicle parameter which it is implemented to measure. Resistor 14 has a resistance RL. Line 18, connected to the junction of resistor 14 and sender 28, has a voltage signal, Vs, proportional to the impedance of sender 28.

Resistors 42 and 48 comprise a second voltage divider, which is connected between line 18 and ground 34. The resistances of resistors 42 and 48 are referred to as R1 and R2, respectively. Line 44, at the connection between the resistors 42 and 48 is referred to as the signal line, and caries a voltage signal Vin proportional to the voltage signal Vs on line 18, which is proportional to sender impedance Rs.

Resistors 40 and 50 comprise a third voltage divider, which is coupled between the voltage supply line 12 and ground 34. The resistances of resistors 40 and 50 are referred to as R3 and R4. Line 46, connected to resistor 50, is referred to as the reference signal line having a voltage signal kVref, where k is a constant explained in further detail below, but for FIG. 2 is equal to 1. Line 46 may be connected to resistor 50 at the junction between resistors 40 and 50, as shown in FIG. 2 (k=1), or, if resistor 50 is replaced by a resistor chain 70 (FIG. 3), line 46 may be connected to a tap in the resistor chain (k<1).

Assuming that Rs<<R1+R2, which is a safe assumption since R1 is large to protect integrated circuit 62 and R2 may be large to maintain a desired voltage range on line 44, the voltage signal, Vs, at line 18 may be defined:

$$Vs = (Rs/(RL+Rs))Vign, \qquad (1)$$

where Vign is the voltage on line 12. The voltage on line 46, kVref, may be defined:

$$kVref = k(R4/(R3+R4))Vign. \qquad (2)$$

The voltage on line 44, Vin, may be defined:

$$Vin = (R2/(R1+R2))Vs. \qquad (3)$$

Equation (1) can be substituted into equation (3) and combined with equation (2) such that:

$$Vin/Vref = (R2/(R1+R2))(Rs/(RL+Rs))/(R4/(R3+R4)). \qquad (4)$$

What is desired is to maintain the ratio Vin/Vref strictly as a function of RL and Rs. If this goal is achieved, then the ratio Vin/(kVref) is unaffected by variances in ignition voltage and temperature change, as Vin/(kVref) is proportional to Vin/Vref. Maintaining the ratio Vin/Vref to be strictly a function of RL and Rs would be easily accomplished if R1=R2=R3=R4 and all four resistors 40, 42, 48 and 50 have the same temperature coefficient. However, precise resistances of resistors on integrated circuits are hard to determine. Additionally, resistors fabricated onto integrated circuits have different temperature coefficients than external resistor components. Since resistors 40 and 42 must be external components and it is desired to fabricate resistors 48 and 50 onto integrated circuit 62, it is impractical to try to achieve the relationships that R1=R2=R3=R4 and that resistors 40, 42, 48 and 50 have the same temperature coefficients.

However, according to this invention, if R3 is set equal to R1, and R2 is set equal to R4, Vin/Vref becomes strictly a function of RL and Rs, since equation (4) simplifies to:

$$Vin/Vref = (Rs/(RL+Rs)). \qquad (5)$$

Since, within integrated circuits, resistances can be made to precisely track one another, R2 can be easily made to be substantially equal to R4, even as temperature varies. Likewise, external resistor components can be made to precisely track one another, so that R1 can be easily made to be substantially equal to R3, even as temperature varies. Therefore, according to this invention, R1=R3, R2=R4, and resistors 48 and 50 are fabricated onto integrated circuit 62, reducing the number of necessary external components and maintaining the ratio of Vin/Vref as a function of Rs and RL. The resulting signal ratio on lines 44 and 46, Vin/(kVref), is then proportional to Rs/(RL+Rs).

Figure 3:
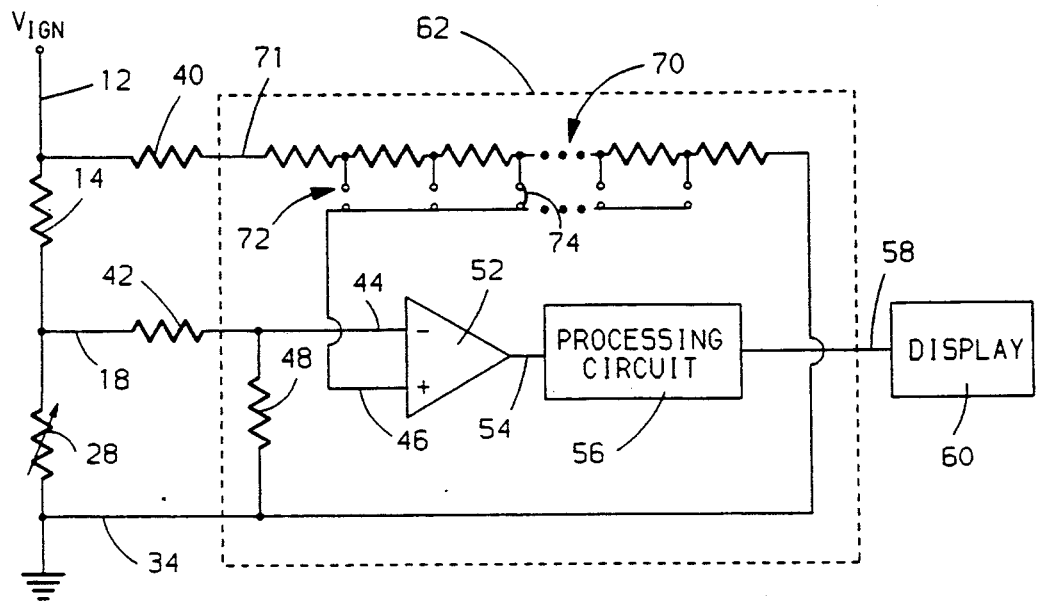
FIGS. 3 and 4 are illustrations of second and third implementations of this invention using an internal resistor chain.

Referring to FIG. 3, resistor 50 may be replaced by resistor chain 70, as mentioned above. Resistor chain 70 comprises a set of resistors connected in series, with taps 72 between each resistor, as shown. A metal mask contact 74 in the integrated circuit may be selectively placed to set the voltage level on line 46. To maintain ratiometric inputs on lines 44 and 46, the total resistance of resistor chain 70 is defined as R4, and set equal to R2.

Referring to the equations above, line 71 carries the signal Vref. The signal on line 46, kVref, may be defined as:

$$kVref = (Ry/(Rx+Ry))Vref, \qquad (6)$$

where Ry+Rx=R4, Rx is the resistance of the portion of resistor chain 70 between mask 74 and line 71 and Ry is the resistance of resistor chain 70 between mask 74 and ground line 34. The individual resistances in resistor chain 70 are fabricated to be equal and have the same temperature coefficient, which is easily accomplished by one skilled in the art, so that Ry/(Rx+Ry) is constant, the constant k, for any given placement of tap 74. The constant k is set during manufacture of the integrated circuit by selecting placement of tap 74. When line 46 is connected to point 71, the circuit in FIG. 3 is equivalent to the circuit in FIG. 2, Rx becomes zero, and k=1.

Modifying equation (5), the ratio of the signals on lines 44 and 46 in FIG. 3 may be defined:

$$Vin/(kVref) = (1/k)(Rs/(RL+Rs)). \qquad (7)$$

As can be seen with equation (7), Vin/(kVref) is dependent upon the placement of tap 74, Rs and RL. The circuit maintains the ratiometric relation of Vin/(kVref) proportional to Rs/(RL+Rs).

Figure 4:
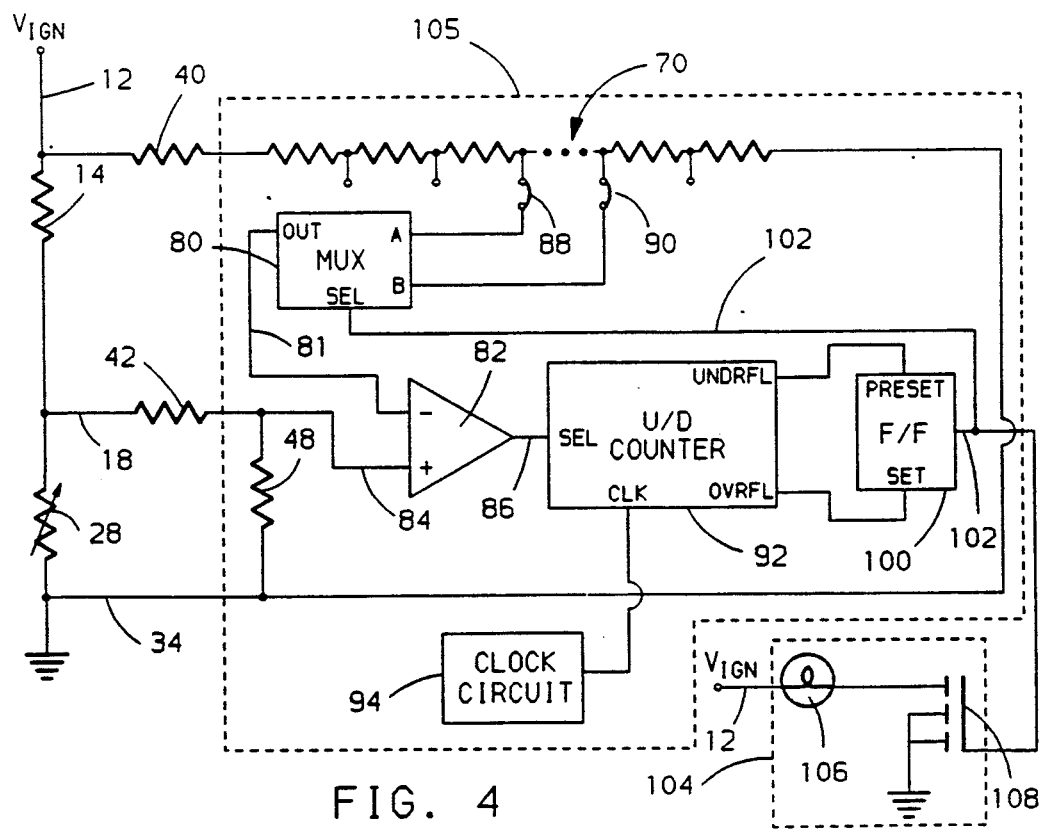

Referring to FIG. 4, this invention is shown implemented with improvements taught by copending patent application, Ser. No. 07/750,083, filed on Aug. 27, 1991. The circuit shown is suitable for driving a telltale display indicating a parameter threshold has been reached, e.g. low oil pressure. The circuitry within integrated circuit 105, including comparator 82, multiplexer 80, resistor chain 70, up/down counter 92, flip flop 100 and clock circuit 94 filters the comparator output signal on line 86. The circuit provides hysteresis to the output line 102, to prevent display 104, e.g., a typical telltale, from flickering on and off when Vin is near the trip point, e.g., a signal corresponding to low oil pressure. The telltale example shown for display 104 includes incandescent lamp 106 and FET 108.

The circuit in FIG. 4 shows that this invention may be implemented with multiple taps in resistor chain 70, e.g., at mask points 88 and 90, that maintain ratiometric relationships with Vin. In circuit operation, multiplexer 80 is selected through a signal on line 102 to couple the signal from mask 88, at input A, to line 81 or the signal from mask 90, at input B, to line 81. The value of the ratio Vin/(kVref) when input A is selected and when the input B is selected varies as a function of the constant k. For example, when input A is selected, constant k has a value k1, the signal on line 46 is k1Vref, and the ratio of the signals on lines 44 and 46 is:

$$Vin/(k1 Vref) = (1/k1)(Rs/(RL+Rs)).$$

When input B is selected, constant k has a value k2, the signal on line 46 is k2Vref, and the ratio of the signals on lines 44 and 46 is:

$$Vin/(k2 Vref) = (1/k2)(Rs/(RL+Rs)),$$

where k1 and k2 depend upon placement of mask points 88 and 90.

The remainder of the functioning of the circuit shown in FIG. 4 is the subject of copending patent application, Ser. No. 07/750,083, filed on Aug. 27, 1991, and explained in detail, along with various other implementations, therein. Therefore FIG. 4 will not be further explained herein.

The above examples illustrate how this invention may be implemented to reduce the number of external components necessary to interface a sender signal with an integrated circuit for processing. The ratiometric operation of the circuit is unaffected by fluctuations in vehicle supply voltage since the ratios Vin/Vref and Vin/(kVref) are independent of Vign.

The above described implementations are merely preferred implementations of this invention and are not limiting on its scope. Moreover, various other improvements and modifications to this invention may occur to those skilled in the art and will fall within the scope of this invention as set forth below.

The embodiments of the invention in which an exclusive property or privilege is claimed are defined as follows:

1. A circuit comprising:
   a first voltage divider including a load resistor having resistance RL and a sender having a variable resistance Rs connected in series between a voltage supply and a ground, the first voltage divider having an output line at the connection between the load resistor and the sender;
   a second voltage divider including a first resistor having resistance R1 and a second resistor having resistance R2 connected in series between the output line of the first voltage divider and ground, the second voltage divider having a signal line containing a signal Vin at the connection between said first and second resistors;
   a third voltage divider including a third resistor having impedance R3 and a fourth resistor having impedance R4 connected in series between the voltage supply and ground, the third voltage divider including a reference line carrying a signal kVref connected to said fourth resistor, wherein R1=R3, R2=R4, said first and third resistors are external resistors and said second and fourth resistors are fabricated on an integrated circuit, and wherein Vin/(kVref) is proportional to Rs/(RL+Rs).

2. The circuit of claim 1 wherein said fourth resistor comprises a set of resistors connected in series, with a series resistance of the set of resistors to R4, wherein the reference line is connected to said fourth resistor at a tap in the set of resistors.

3. The circuit of claim 1 where k=1.

4. The circuit of claim 1 wherein said fourth resistor comprises a set of resistors connected in series, with a series resistance of the set of resistors equal to R4, wherein the reference line is selectively coupled to said fourth resistor at alternating taps in the set of resistors.

5. A circuit for receiving an analog signal comprising:
   a load resistor and a variable impedance sender connected in series between a voltage supply and ground;
   a reference voltage divider comprising two resistors connected in series between the voltage supply and ground, the two resistors of the reference voltage divider comprising an external reference resistor and an internal reference resistor, a voltage line carrying a voltage signal kVref connected to the internal reference resistor;
   an input voltage divider comprising two resistors connected in series across the sender, the two resistors of the input voltage divider comprising an external input resistor and an internal input resistor, the input series connection having a voltage signal Vin, wherein the external reference resistor is substantially equal to the external input resistor, the internal reference resistor is substantially equal to the internal input resistor and the two internal resistors are fabricated on an integrated circuit, whereby Vin/(kVref) is substantially proportional to Rs/(RL+Rs).

6. An apparatus including a voltage supply line and a ground line, comprising:
   a load resistor having an resistance RL external to an integrated circuit;
   a sender having a variable resistance Rs external to the integrated circuit;
   a first resistor having a resistance R1 external to the integrated circuit;
   a second resistor having a resistance R2, fabricated on the integrated circuit;
   a third resistor having a resistance R3 substantially equal to R1, external to the circuit; and
   a resistor chain, fabricated on the integrated circuit, having a first end and a second end comprising a set of resistors connected in series and a set of taps, one tap at each series connection of the resistor chain, the resistor chain having a total resistance R4 substantially equal to R2, wherein
   the load resistor and sender are connected in series, the load resistor being also connected to the voltage supply line and the sender being also connected to the ground line,
   the first and second resistors are connected in series, the first resister being also connected to the connection between the load resistor and the sender and the second resistor being also connected to the ground line,
   the third resistor is connected in series to one end of the resistor chain, the third resistor being also connected to the voltage supply line and the other end of the resistor chain being connected to the ground line, and
   the connection between the first and second resistors has a voltage level Vin and a selected tap in the resistor chain has a voltage level kVref, wherein Vin/(kVref) is proportional to Rs/(RL+Rs).

* * * * *